United States Patent
Shu et al.

(10) Patent No.: US 11,362,178 B2
(45) Date of Patent: Jun. 14, 2022

(54) ASYMMETRIC SOURCE DRAIN STRUCTURES

(71) Applicant: GLOBALFOUNDRIES U.S. INC., Santa Clara, CA (US)

(72) Inventors: Jiehui Shu, Dalian (CN); Rinus Tek Po Lee, Ballston Spa, NY (US); Baofu Zhu, Clifton Park, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 77 days.

(21) Appl. No.: 16/676,488

(22) Filed: Nov. 7, 2019

(65) Prior Publication Data

US 2021/0143254 A1    May 13, 2021

(51) Int. Cl.
| | |
|---|---|
| *H01L 29/08* | (2006.01) |
| *H01L 29/78* | (2006.01) |
| *H01L 29/66* | (2006.01) |
| *H01L 21/8234* | (2006.01) |
| *H01L 29/423* | (2006.01) |
| *H01L 27/088* | (2006.01) |

(52) U.S. Cl.
CPC .. *H01L 29/0847* (2013.01); *H01L 21/823425* (2013.01); *H01L 21/823468* (2013.01); *H01L 27/088* (2013.01); *H01L 29/42356* (2013.01); *H01L 29/6653* (2013.01); *H01L 29/6656* (2013.01); *H01L 29/66795* (2013.01); *H01L 29/785* (2013.01)

(58) Field of Classification Search
CPC ......... H01L 29/0847; H01L 21/823468; H01L 29/42356; H01L 21/823425; H01L 29/66795; H01L 29/6656; H01L 29/6653; H01L 27/088; H01L 29/785; H01L 21/823418; H01L 29/66628; H01L 29/66636; H01L 29/66659; H01L 29/78; H01L 29/66545
See application file for complete search history.

(56) References Cited

U.S. PATENT DOCUMENTS

| | | |
|---|---|---|
| 5,789,298 A | 8/1998 | Gardner et al. |
| 6,794,256 B1 | 9/2004 | Fuselier et al. |
| 7,354,839 B2 | 4/2008 | Wei et al. |
| 7,989,297 B2 | 8/2011 | Yin et al. |
| 2006/0194381 A1* | 8/2006 | Wei ...................... H01L 29/7835 438/197 |
| 2009/0159936 A1* | 6/2009 | Shah .................... H01L 29/6653 257/288 |
| 2010/0078736 A1* | 4/2010 | Hoentschel ..... H01L 21/823864 257/408 |
| 2011/0049582 A1 | 3/2011 | Johnson et al. |
| 2016/0049496 A1* | 2/2016 | Lu ..................... H01L 21/02057 257/401 |

* cited by examiner

*Primary Examiner* — Ermias T Woldegeorgis
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to asymmetric source and drain structures and methods of manufacture. The structure includes: at least one gate structure; a straight spacer adjacent to the at least one gate structure; and an L-shaped spacer on a side of the at least one gate structure opposing the straight spacer, the L-shaped spacer extending a first diffusion region further away from the at least one gate structure than the straight spacer extends a second diffusion region on a second side away from the at least one gate structure.

20 Claims, 4 Drawing Sheets

ASYMMETRIC SOURCE DRAIN STRUCTURES

FIELD OF THE INVENTION

The present disclosure relates to semiconductor structures and, more particularly, to asymmetric source and drain structures and methods of manufacture.

BACKGROUND

Many advances have been achieved within integrated circuit transistors by forming the transistors to be asymmetric. For example, with asymmetric transistors, both series resistance in the source region and gate to drain capacitance are reduced in order to provide optimal performance (i.e., to provide improved drive current with minimal circuit delay). Specifically, different heights of the source and drain regions and/or different distances between the source and drain regions and the gate can be tailored to minimize series resistance in the source region (i.e., in order to ensure that series resistance is less than a predetermined resistance value) and to simultaneously minimize gate to drain capacitance (i.e., in order to simultaneously ensure that gate to drain capacitance is less than a predetermined capacitance value).

However, as scaling of devices continue, e.g., as critical dimensions of devices shrink, it is becoming ever more difficult to manufacture asymmetric transistors while gaining benefits. For example, with known processes, devices show significant gate-induced drain leakage (GIDL) current at Vd=−4V. Id@Vg=Vs=Vb=0 is up to 10 nA for some devices. This prevents from working at Vd=4V to meet leakage specification 1 nA/4Fin.

SUMMARY

In an aspect of the disclosure, a structure comprises: at least one gate structure; a straight spacer adjacent to the at least one gate structure; and an L-shaped spacer on a side of the at least one gate structure opposing the straight spacer, the L-shaped spacer extending a first diffusion region further away from the at least one gate structure than the straight spacer extends a second diffusion region on a second side away from the at least one gate structure.

In an aspect of the disclosure, a structure comprising: a plurality of gate structures over a substrate; a first diffusion region between adjacent gate structures of the plurality of gate structures; a second diffusion region on opposing sides of the first diffusion region for each of the plurality of gate structures; L-shaped spacers on sidewalls of the adjacent gate structures, adjacent to the first diffusion region; and straight spacers on sidewalls of the adjacent gate structures, on opposing sides of the first diffusion region.

In an aspect of the disclosure, a structure comprising: a first epitaxial region at a first diffusion side only side of a gate structure, spaced away from the drain side by an L-shape spacer at first diffusion side only; and a second epitaxial region at a second diffusion side only side of the gate structure, spaced away from the second diffusion side by a straight spacer at the second diffusion side only.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
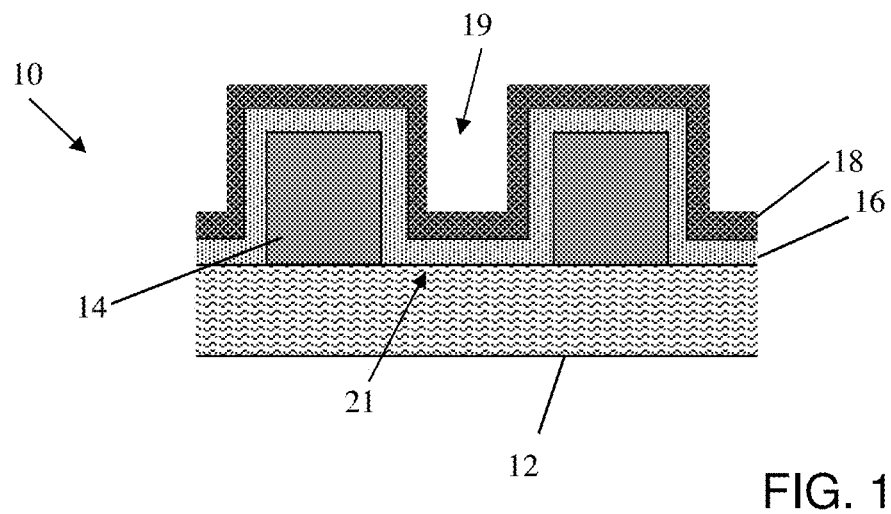
FIG. 1 shows a dummy gate structure, amongst other features, and respective fabrication processes in accordance with aspects of the present disclosure.

The present disclosure relates to semiconductor structures and, more particularly, to asymmetric source and drain structures and methods of manufacture. More specifically, the present disclosure relates to structures and methods of fabricating asymmetrical source/drain epitaxial regions using an L-shaped spacer. Advantageously, the structures described herein provide significant gate-induced drain leakage (GIDL) current reduction by increasing drain structure proximity (e.g., distance) to the gate structure.

In embodiments, the asymmetrical devices show much weaker band to band tunneling generation and lower GIDL leakage current than known devices. For example, the structures implement an L-shape spacer on the drain side only, which effective moves the drain region (e.g., cavity proximity) further way from the gate, itself. This effectively reduces the GIDL current, e.g., significant GIDL current reduction at Vd=−4V. The asymmetrical devices also show approximately two (2) order lower Idoff than known devices, mainly from Ixoff reduction. Also, a smaller epitaxial drain region is formed at the drain side by implementing the L-shape spacer. A straight shape spacer at the source side is used to form epitaxial material at the source side which maintains the proximity of the source region (e.g., cavity proximity) closer to the gate.

In embodiments, the structure comprises one or more gate structures over a substrate. The gate structures can be finFET structures. The gate structures include L-shaped spacers on the sidewalls adjacent to the drain region (on facing sides of adjacent gate structures) and straight spacers on the sidewalls adjacent to the source regions on opposing sides of the gate structures. The L-shaped spacers adjacent to the drain regions are effectively thicker than the straight (vertical) spacers adjacent to the source regions, thereby extending (e.g., pulling) the drain regions further away from the gate structure (compared to the source region). In embodiments, using a cavity to form the source/drain regions, the proximity of the cavity on the drain side is further away from the gate, which effectively reduces the GIDL current. In alternative embodiments, the L-shaped spacers can be used with raised source/drain regions, which will extend the raised epitaxial material for the drain regions further away from the gate structure.

The gate structures with asymmetrical drain and source regions of the present disclosure can be manufactured in a number of ways using a number of different tools. In general, though, the methodologies and tools are used to form structures with dimensions in the micrometer and nanometer scale. The methodologies, i.e., technologies, employed to manufacture the gate structures with asymmetrical drain and source regions of the present disclosure have been adopted from integrated circuit (IC) technology. For example, the structures are built on wafers and are realized in films of material patterned by photolithographic processes on the top of a wafer. In particular, the fabrication of the gate structures with asymmetrical drain and source regions uses three basic building blocks: (i) deposition of thin films of material on a substrate, (ii) applying a patterned mask on top of the films by photolithographic imaging, and (iii) etching the films selectively to the mask.

FIG. 1 shows a dummy gate structure, amongst other features, and respective fabrication processes in accordance with aspects of the present disclosure. The structure 10 of FIG. 1 includes a substrate material 12 and dummy gate structures 14 formed on the substrate material 12. In embodiments, the substrate material 12 can be composed of any suitable semiconductor material including, but not limited to, Si, SiGe, SiGeC, SiC, alloys, GaAs, InAs, InP, and other III/V or II/VI compound semiconductors.

In embodiments, the substrate material 12 can be a single semiconducting material such as bulk silicon. The substrate material 12 may also be based on semiconductor on insulator (SOI) technology, which includes an insulator layer on top of the semiconductor layer and a semiconductor layer (e.g., silicon) on the insulator layer. The insulator layer comprises any suitable material, including silicon oxide, sapphire, other suitable insulating materials, and/or combinations thereof. An exemplary insulator layer may be a buried oxide layer (BOX) formed by any suitable process, such as separation by implantation of oxygen (SiMOX), oxidation, deposition, and/or other suitable process. A semiconductor layer (substrate material 12) is on top of the insulator layer to form the SOI substrate, which can be fabricated using wafer bonding and/or other suitable methods.

In embodiments, the substrate material 12 is representative of a fin structure. The fin structure can be fabricated by conventional lithography and etching processes including a sidewall imaging transfer (SIT) technique. In an example of a SIT technique, a mandrel material, e.g., SiO$_2$, is deposited on the substrate material 12 using conventional CVD processes. A resist is formed on the mandrel material and exposed to light to form a pattern (openings). A reactive ion etching (RIE) is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the narrow fin structures 20, for example. The mandrels are removed or stripped using a conventional etching process, selective to the mandrel material. An etching is then performed within the spacing of the spacers to form the sub-lithographic features. The sidewall spacers can then be stripped.

Still referring to FIG. 1, the dummy gate structures 14 can be amorphous Si or SiC, as an example. The dummy gate structures 14 can be formed by conventional deposition, lithography and etching processes. For example, the material of the dummy gate structures 14 can be deposited using a conventional chemical vapor deposition (CVD) process, followed by a patterning process using conventional lithography and etching (RIE) processes as is known by one of skill in the art such that a detailed explanation is not required herein for an understanding of these processes.

A spacer material 16 is deposited on the dummy gate structures 14 and on exposed surfaces of the substrate material 12. In embodiments, the spacer material 16 can be a low-k spacer material, e.g., SiOCN, SiBCN, SiCN. The spacer material 16 can be blanket deposited over the dummy gate structures 14 and exposed portions of the substrate material 12 by using conventional deposition processes including, e.g., atomic layer deposition (ALD) processes, which provides sufficient conformity. The spacer material 16 should preferably be deposited to a thickness which leaves a space or opening (designated at reference numeral 19) between the adjacent gate structures 14. For example, the spacer material 16 can be deposited to a depth of 4 to 10 nm; although other dimensions are contemplated herein.

Following the deposition of the spacer material 16, a sacrificial liner 18 is deposited on the spacer material 16. In embodiments, the sacrificial liner 18 is deposited by an ALD or CVD process, as examples. The sacrificial liner 18 can be, e.g., aSi, aSiGe, Al$_2$O$_3$, TiO$_2$, or other material that has an etch selectivity to the underlying materials. The sacrificial liner 18 should preferably be deposited to a thickness which leaves a space or opening 19 between the adjacent gate structures 14 over the drain region (e.g., first diffusion) 21 of both dummy gate structures 14. The drain region (e.g., first diffusion) 21 can be shared by adjacent gate structures.

Figure 2:
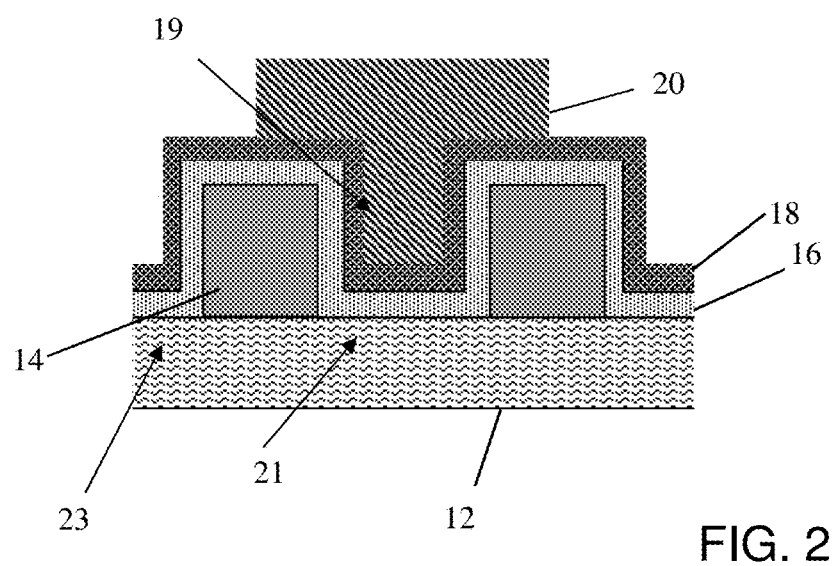
FIG. 2 shows a masking material deposited over a sacrificial liner, amongst other features, and respective fabrication processes in accordance with aspects of the present disclosure.

As shown in FIG. 2, a masking material 20 is deposited over the sacrificial liner 18 and within the space 19. The masking material 20 can be SOH or SiO$_2$, as examples. In other embodiments, the sacrificial material 20 should be material with an etch selectivity to the spacer material 16 and sacrificial liner 18. The masking material 20 undergoes a patterning process, e.g., conventional lithography and etching (RIE) process, resulting in the masking material 20 masking the drain region 21, e.g., within the space or opening 19. In this way, the sacrificial liner 18 over a source region (e.g., second diffusion) 23 of the gate structures will be exposed.

Figure 3:
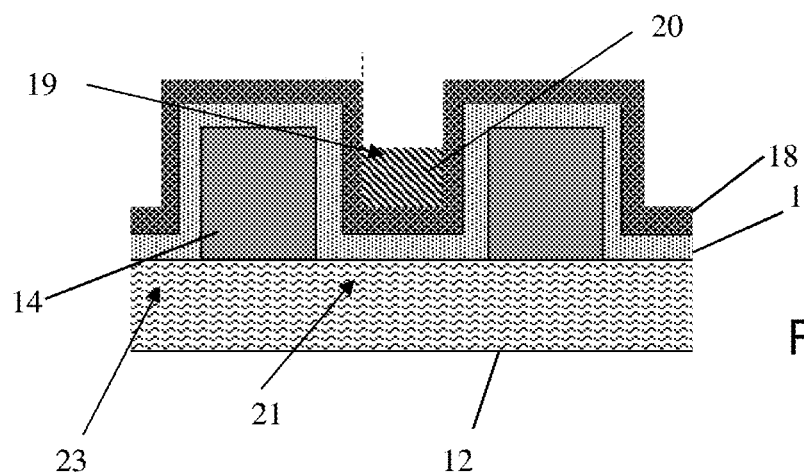
FIG. 3 shows the masking material recessed within an opening or space between adjacent gate structures, amongst other features, and respective fabrication processes in accordance with aspects of the present disclosure.

In FIG. 3, the masking material 20 is recessed within the opening or space 19 between the adjacent gate structures 14. In embodiments, the recessing of the masking material 20 can be performed by a maskless timed etching process due to the etch selectivity between the masking material 20 and the sacrificial liner 18.

Figure 4:
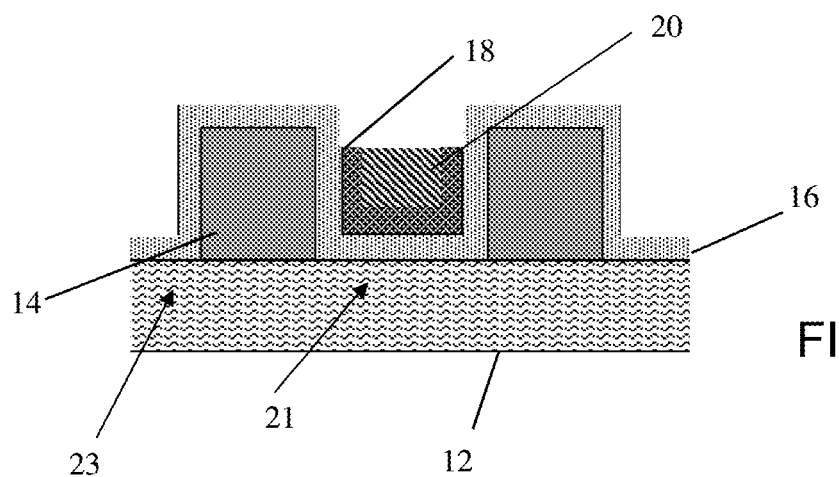
FIG. 4 shows removal of exposed portions of the sacrificial liner, amongst other features, and respective fabrication processes in accordance with aspects of the present disclosure.

As further shown in FIG. 4, exposed portions of the sacrificial liner 18 are removed by an etching process. In this way, the sacrificial liner 18 will be recessed to a height of the masking material 20. At this fabrication stage, the masking material 20 over the sacrificial liner 18 in the drain region 21 will protect the sacrificial liner 18 from completely etching away. In embodiments, the etching process is an isotropic etching process with a selective chemistry to the sacrificial liner 18.

Figure 5:
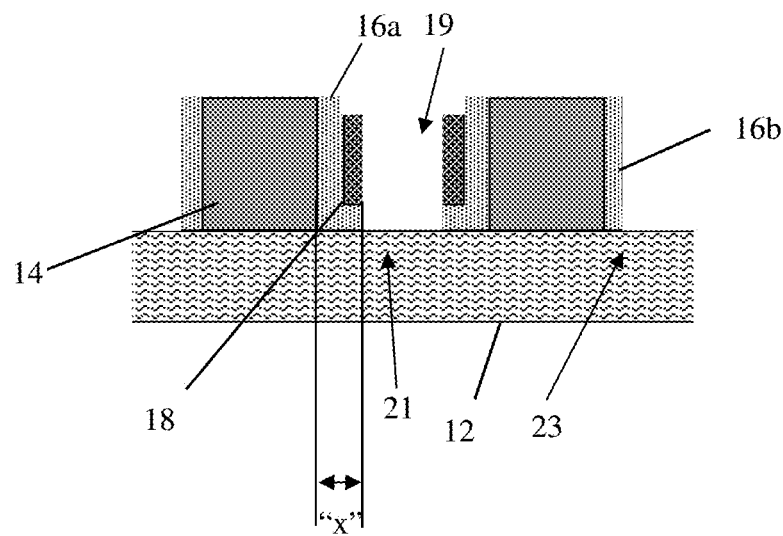
FIG. 5 shows an L-shaped spacer and a straight spacer, amongst other features, and respective fabrication processes in accordance with aspects of the present disclosure.

In FIG. 5, the masking material 20 is removed by an etching process, e.g., isotropic etching process. Following the removal of the masking material 20, the sacrificial liner 18 at the bottom of the opening or spacer 19 in the drain region 21 is removed by an anisotropic etching process. The anisotropic etching process will leave the sacrificial liner 18 on the sidewalls of the spacer material 16. The spacer material 16 on the horizontal surface of the substrate 12, e.g., in the source region 23 and drain region 21 (at the bottom of the space or opening 19), and the horizontal surfaces of the gate structures 14 will also be removed by a conventional etching process, which exposes the substrate material 12 in the drain region 21 and the source region 23, as well as the material of the dummy gate structures 14.

In this latter etching process, the sacrificial liner 18 will protect the sidewalls and a portion of the bottom of the spacer material 16 on the sides of the gate structures 14 from being eroded or etched away during the etching processes. This will effectively form an L-shaped spacer 16a adjacent to the gate structures 14 in the drain region 21 and a straight (vertical) spacer 16b adjacent to the gate structures 14 in the source region 23. In embodiments, the L-shaped spacer 16 can a leg extending away from the gate structure 14 with a dimension of "x", which can be about 2 nm to about 10 nm. This distance effectively pulls (extends) the drain region 21 further away from the gate structures 14, compared to the source region 23.

Figure 6:
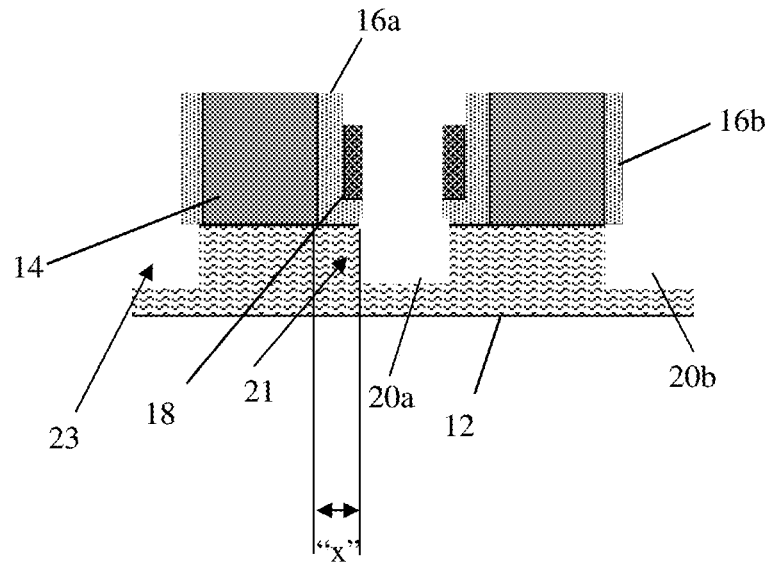
FIG. 6 shows source and drain cavities, amongst other features, and respective fabrication processes in accordance with aspects of the present disclosure.

FIG. 6 shows the formation of source and drain cavities in accordance with aspects of the present disclosure. More specifically, in FIG. 6, the exposed substrate material 12 in the drain region 21 and the source region 23 are subjected to an etching process to form respective cavities 20a, 20b. The cavities 20a, 20b can be formed by conventional selective etching methods known to those of skill in the art. By way of example, an etching process with a selective chemistry, e.g., RIE, will be used to form the cavities 20a, 20b through the exposed substrate material 12. The etching process can be an anisotropic etching process followed by an isotropic etching process, with selective chemistries to the substrate material 12. Alternatively, the etching process can be an anisotropic etching process.

The cavities 20a, 20b can be of many different shapes, e.g., square, rectangle, ball shaped, etc., depending on the etch chemistry and timing of the etching process, as should be understood by those of skill in the art such that no further explanation is required for a complete understanding of such processes. In embodiments, the cavity 20a on the drain side is smaller than the cavity 20b on the source side, due to the L-shaped spacers 16a. Moreover, as shown in FIG. 6, the cavity 20a in the drain region 21 is further away from the gate structure than the cavity 20b in the source region 23 due to the implementation of the L-shaped spacer 16a and the straight spacer 16b.

Figure 7:
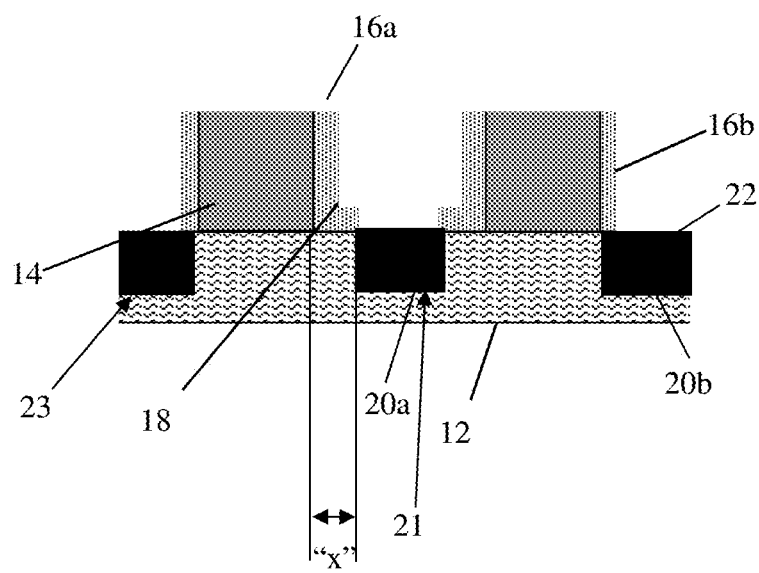
FIG. 7 shows the source and drain cavities filled with doped epitaxial material, amongst other features, and respective fabrication processes in accordance with aspects of the present disclosure.

In FIG. 7, the sacrificial liner 18 on the sides of the gate structures 14 will be removed leaving the L-shaped spacer 16a adjacent to the gate structures 14. The sacrificial liner 18 can be removed by a conventional etching process with a selective chemistry. In this way, the etching process can be a maskless process. If, for example, the sacrificial liner 18 is aSi, it can be consumed during the cavity etching process, thereby eliminating a separate etching process for removal of the sacrificial liner 18.

The cavities 20a, 20b are filled with a doped epitaxial material to form the source region 23 and the drain region 21. As the cavity 20a on the drain side is smaller than the cavity 20b on the source side, the drain region 21 is smaller than the source region 23. In embodiments, the epitaxial material is a doped semiconductor material, e.g., P doped, which is formed by a growing process. As should be understood by those of ordinary skill in the art, the material of the L-shaped spacer 16a, the straight spacer 16b and the exposed dummy material will prevent the growth of the epitaxial material in those regions of the structure. By implementing the L-shaped spacer 16a and the straight spacer 16b, the epitaxial material for the drain region 23 will be further away (e.g., distance "x") from the gate structure than the epitaxial material for the source region 21.

Figure 8:
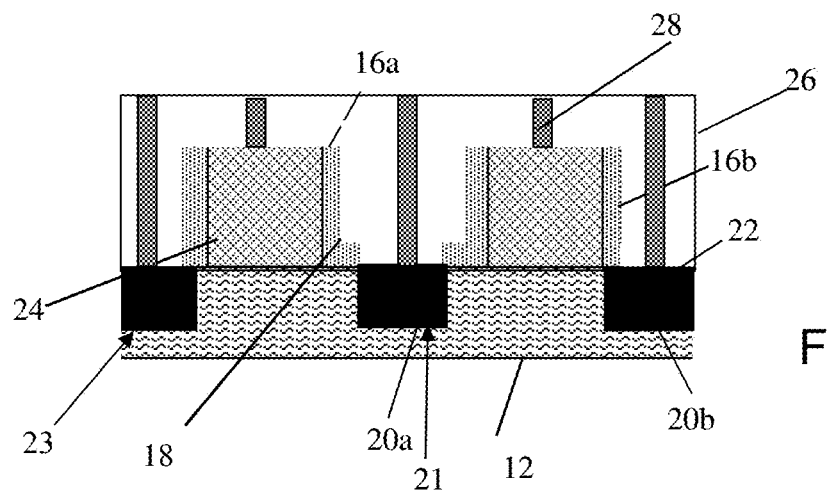
FIG. 8 shows replacement gate structures, amongst other features, and respective fabrication processes in accordance with aspects of the present disclosure.

FIG. 8 shows replacement gate structures 24 with contacts 26. In embodiments, the replacement gate structures 24 are formed by pulling (extending) out the material of the dummy gate structure 14 and replacing the material with gate material, i.e., high-k gate dielectric material and a stack of one or more workfunction metals. In embodiments, the gate dielectric material can be a high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. Examples of the workfunction materials for a p-channel FET include Ti, TiAlC, Al, TiAl, TaN, TaAlC, TiN, TiC and Co. Examples of the workfunction materials for an n-channel FET include TiN, TaN, TaAlC, TiC, TiAl, TaC, Co, Al, TiAl, HfTi, TiSi, TaSi or TiAlC. In one embodiment, TaAlC, TiAl or Al is used for an n-channel FET. The workfunction materials may be formed by chemical vapor deposition (CVD), physical vapor deposition (PVD) including sputtering, atomic layer deposition (ALD) or other suitable method.

The source region 23 and the drain region 21 undergo a silicide process to form silicide contacts on the epitaxial material 22. As should be understood by those of skill in the art, the silicide process begins with deposition of a thin transition metal layer, e.g., nickel, cobalt or titanium, over fully formed and patterned semiconductor devices (e.g., doped or ion implanted source and drain regions 23, 21 and respective devices 24. After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

An interlevel dielectric material 26 is deposited over the structure using, e.g., CVD processes. Contacts 28 are formed through the interlevel dielectric material 26 and in contact with the gate structures 24 and source regions 23 and drain regions 21. The contacts 28, e.g., interconnect structures, can be formed by conventional lithography, etching and deposition methods known to those of skill in the art. For example, a resist formed over the insulator material, e.g., interlevel dielectric material 26, is exposed to energy (light) to form a pattern (opening). An etching process with a selective chemistry, e.g., RIE, will be used to form one or more trenches in the interlevel dielectric material 26 through the openings of the resist. The resist can then be removed by a conventional oxygen ashing process or other known stripants. Following the resist removal, conductive material can be deposited by any conventional deposition processes, e.g., chemical vapor deposition (CVD) processes. Any residual material on the surface of the interlevel dielectric material 26 can be removed by conventional chemical mechanical polishing (CMP) processes.

Figure 9:
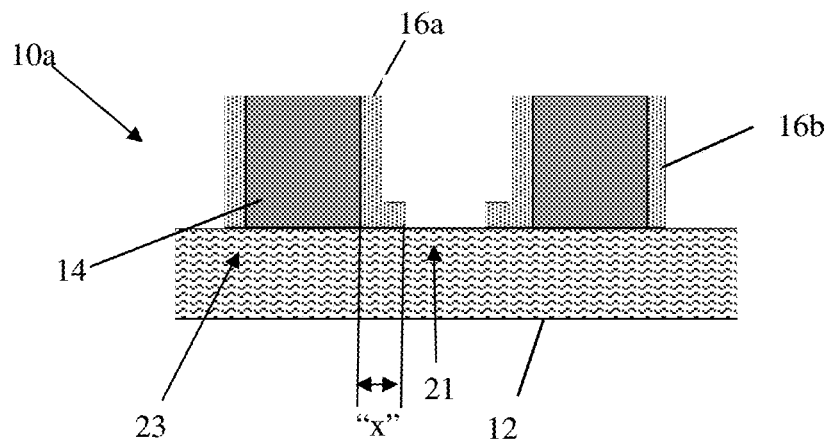
FIGS. 9 and 10 show alternative structures and respective fabrication processes in accordance with aspects of the present disclosure.
Figure 10:
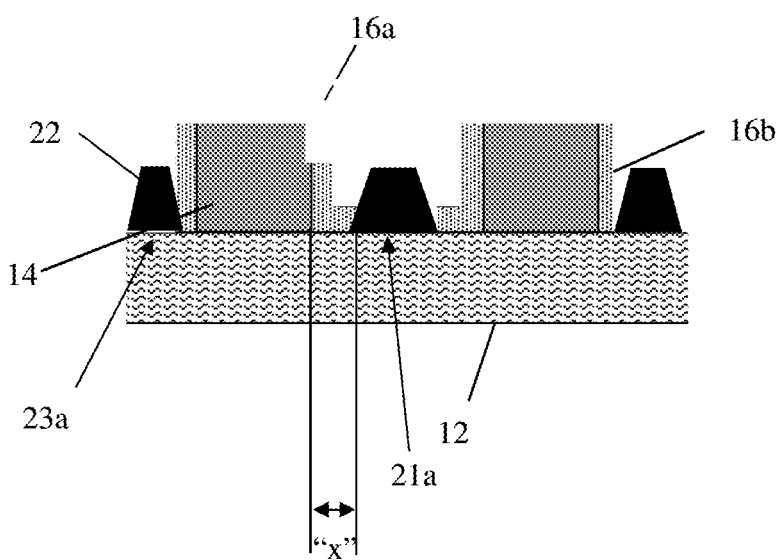

FIGS. 9 and 10 show alternative structures and respective fabrication processes in accordance with aspects of the present disclosure. Referring to FIG. 9, after formation of the L-shaped spacer 16a and straight spacer 16b as shown in FIG. 5, the structure 10a will undergo removal of the sacrificial liner 18 from the spacer material 16 by an isotropic etching process. Now, instead of forming the cavities, raised source regions 23a and raised drain regions 21a are formed in FIG. 10 using an epitaxial growth process. In embodiments, the epitaxial material is a doped semiconductor material, e.g., P doped, which is formed by a growing process on the exposed portions of the substrate 12. As should be understood by those of ordinary skill in the art, the material of the L-shaped spacer 16a, the straight spacer 16b and the exposed dummy material will prevent the growth of the epitaxial material in those regions of the structure. Also, by using the L-shaped spacer 16a and the straight spacer 16b, the epitaxial material for the drain region 23 will be further away (e.g., distance "x") from the gate structure 14 than the epitaxial material for the source region 21. Moreover, the raised epitaxial material for the drain region is smaller than the raised epitaxial material for the source region 23. The processes may then continue as described with respect to FIG. 7 to form the replacement gate processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   at least one gate structure;
   a straight spacer adjacent to the at least one gate structure; and
   an L-shaped spacer on a side of the at least one gate structure opposing the straight spacer, the L-shaped spacer extending a first diffusion region further away from the at least one gate structure than the straight spacer extending a second diffusion region on a second side away from the at least one gate structure,
   wherein the at least one gate structure is two adjacent gate structures each of which have an L-shaped spacer facing one another on their second side and further comprising:
      a shared epitaxial material in between the two adjacent gate structures and spaced away from each of the gate structures by the L-shaped spacers of the respective two adjacent gate structures; and
      an epitaxial material spaced away by the straight spacer at a diffusion side of at least one of the two adjacent gate structures.

2. The structure of claim 1, wherein the L-shaped spacer is thicker than the straight spacer.

3. The structure of claim 2, wherein the L-shaped spacer and the straight spacer are provided on opposing sidewalls of the at least one gate structure.

4. The structure of claim 3, wherein the first diffusion region and the second diffusion region are epitaxial growth regions.

5. The structure of claim 4, wherein the epitaxial growth regions are in cavities of a substrate material adjacent to the at least one gate structure.

6. The structure of claim 5, wherein the epitaxial growth regions of the first diffusion region is farther away from the at least one gate structure than the epitaxial growth regions of the second diffusion region of the at least one gate structure.

7. The structure of claim 1, wherein the first diffusion region and the second diffusion region are raised epitaxial growth regions.

8. The structure of claim 1, wherein the L-shaped spacer has a leg extending away from the at least one gate structure, which extends the first diffusion region away from the at least one gate structure.

9. The structure of claim 1, wherein the first diffusion region is shared between the two adjacent gate structures, each of which are further away from the gate structure than the second diffusion region.

10. A structure comprising:
    a plurality of gate structures over a substrate;
    a first diffusion region between adjacent gate structures of the plurality of gate structures;
    a second diffusion region on opposing sides of the first diffusion region for each of the plurality of gate structures;
    L-shaped spacers on sidewalls of the adjacent gate structures, adjacent to the first diffusion region; and
    straight spacers on sidewalls of the adjacent gate structures, on opposing sides of the first diffusion region,
    wherein the L-shaped spacers are facing each other, and the first diffusion region is spaced away from two gate structures of the adjacent gate structures by the L-shaped spacers,
    the first diffusion region and the second diffusion region are epitaxial material,
    the epitaxial material comprises a shared epitaxial material in between adjacent gate structures and spaced away from each of the gate structures by the L-shaped spacers of the adjacent gate structures; and
    the epitaxial material further comprises an epitaxial layer spaced away by the straight spacers at a diffusion side of at least one of the adjacent gate structures.

11. The structure of claim 10, wherein the epitaxial material is grown in cavities on sides of the adjacent gate structures, the first diffusion region comprises a shared epitaxial in between the two gate structures and the epitaxial material of the second diffusion region is spaced away by the straight spacers at a diffusion side of two gate structures.

12. The structure of claim 11, wherein the cavity for the first diffusion region is farther away from the adjacent gate structures than the cavity for the second diffusion region.

13. The structure of claim 10, wherein the L-shaped spacers are thicker than the straight spacers.

14. The structure of claim 10, wherein the first diffusion region is further from the adjacent gate structures than the second diffusion region which can effective reduces gate-induced drain leakage (GIDL) current.

15. The structure of claim 10, wherein the first diffusion region and the second diffusion region are raised epitaxial regions, with the raised epitaxial region for the first diffusion region being smaller than the raised epitaxial region for the second diffusion region.

16. A structure comprising:
   a shared epitaxial region at a shared diffusion side of adjacent gate structures, the shared epitaxial region being spaced away from each of the adjacent gate structures by an L-shape spacer on a side of the shared diffusion side; and
   an epitaxial region at a diffusion side of at least one of the adjacent gate structures, the epitaxial region being spaced away from the at least one gate structure by a straight spacer on a side of the diffusion side.

17. The structure of claim 16, wherein the shared epitaxial region is smaller than the epitaxial region.

18. The structure of claim 16, wherein the shared epitaxial region is between two gate structures, each of which have the L-shape spacer, the L-shape spacer for each of the two gate structures are facing one another.

19. The structure of claim 16, wherein the shared epitaxial region and the epitaxial region are raised epitaxial regions on an upper surface of a substrate material.

20. The structure of claim 16, wherein the shared epitaxial region and the epitaxial region are planar epitaxial regions with an upper surface of a substrate material.

* * * * *